(12) United States Patent
Lof et al.

(10) Patent No.: US 11,022,903 B2
(45) Date of Patent: Jun. 1, 2021

(54) METHOD FOR TEMPERATURE CONTROL OF A COMPONENT

(71) Applicant: Carl Zeiss SMT GmbH, Oberkochen (DE)

(72) Inventors: Joeri Lof, Eindhoven (NL); Harmen Krediet, Utrecht (NL); Timo Laufer, Stuttgart (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 16/841,139

(22) Filed: Apr. 6, 2020

(65) Prior Publication Data

US 2020/0233318 A1  Jul. 23, 2020

Related U.S. Application Data

(63) Continuation of application No. PCT/EP2018/077276, filed on Oct. 8, 2018.

(30) Foreign Application Priority Data

Oct. 25, 2017 (DE) .......................... 102017219151.1
Jan. 29, 2018 (DE) .......................... 102018201320.9

(51) Int. Cl.
*G03F 7/20* (2006.01)
*G02B 7/00* (2021.01)
*G02B 7/18* (2021.01)

(52) U.S. Cl.
CPC ......... *G03F 7/70875* (2013.01); *G02B 7/008* (2013.01); *G02B 7/1815* (2013.01); *G03F 7/705* (2013.01); *G03F 7/70825* (2013.01)

(58) Field of Classification Search
CPC ............. G03F 7/70141; G03F 7/70258; G03F 7/70483; G03F 7/70491; G03F 7/705;
(Continued)

(56) References Cited

U.S. PATENT DOCUMENTS

2007/0070324 A1* 3/2007 Kuit .................... G03F 7/70741
355/72
2007/0272680 A1 11/2007 Takokaro et al.
(Continued)

FOREIGN PATENT DOCUMENTS

DE 102013215197 A1 6/2014
DE 102013203338 A1 8/2014
(Continued)

OTHER PUBLICATIONS

Notification Concerning Transmittal of International Preliminary Report on Patentability (Chapter I of the Patent Cooperation Treaty) issued in corresponding International Application No. PCT/EP2018/077276 dated May 7, 2020, 9 pages.
(Continued)

*Primary Examiner* — Christina A Riddle
(74) *Attorney, Agent, or Firm* — Fish & Richardson P.C.

(57) ABSTRACT

A method for temperature control of a component that is transferable between a first system and a second system includes: ascertaining a temperature drift of a temperature of the component that is to be expected after transfer of the component from the first system into the second system; and modifying a temperature prevailing in the first system and/or a temperature prevailing in the second system such that the temperature drift that is actually occurring after transfer of the component from the first system into the second system is reduced with respect to the expected temperature drift.

20 Claims, 6 Drawing Sheets

(58) Field of Classification Search
CPC ............. G03F 7/70508; G03F 7/70533; G03F 7/70541; G03F 7/70741; G03F 7/70783; G03F 7/70825; G03F 7/7085; G03F 7/70875; G03F 7/70975; G03F 7/70991; G03F 1/84; G03F 7/70591; G03F 7/70858–70891; G02B 7/008; G02B 7/1815; G05D 23/1917; H01L 21/67248
USPC .......... 355/30, 52–55, 67–71, 77; 250/492.1, 250/492.2, 492.22, 493.1, 503.1, 504 R; 430/5
See application file for complete search history.

(56) References Cited

U.S. PATENT DOCUMENTS

| | | | | |
|---|---|---|---|---|
| 2008/0273180 | A1* | 11/2008 | Roux | G03F 7/70308 355/30 |
| 2009/0279059 | A1* | 11/2009 | Shirata | G03F 7/70858 355/30 |
| 2012/0120379 | A1* | 5/2012 | Phillips | G03F 7/70875 355/52 |
| 2013/0107236 | A1 | 5/2013 | Westerlaken et al. | |
| 2016/0026093 | A1 | 1/2016 | Hauf et al. | |
| 2016/0179018 | A1* | 6/2016 | Holzmann | G03F 7/70891 355/30 |
| 2017/0343449 | A1 | 11/2017 | Stiepan et al. | |

FOREIGN PATENT DOCUMENTS

| | | |
|---|---|---|
| DE | 102015224281 A1 | 9/2016 |
| DE | 102017115240 A1 | 8/2018 |
| EP | 1 531 364 | 7/2013 |
| WO | WO 2014/139763 A1 | 9/2014 |
| WO | WO 2016/142185 A1 | 9/2016 |
| WO | WO 2019/063247 A1 | 4/2019 |

OTHER PUBLICATIONS

German Office Action, and English translation thereof, issued in DE Application No. 10 2017 219 151.1 dated Oct. 15, 2018.
International Search Report and Written Opinion from the counterpart PCT Application No. PCT/EP2018/077276, dated Oct. 8, 2018.

* cited by examiner

METHOD FOR TEMPERATURE CONTROL OF A COMPONENT

CROSS-REFERENCE TO RELATED APPLICATIONS

The present application is a continuation of, and claims benefit under 35 USC 120 to, international application PCT/EP2018/077276, filed Oct. 8, 2018, which claims benefit under 35 USC 119 of German Applications DE 10 2017 219 151.1, filed on Oct. 25, 2017, and DE 10 2018 201 320.9, filed on Jan. 29, 2018. The entire disclosure of each of these applications is incorporated by reference herein.

FIELD

The disclosure relates to a method for temperature control of a component, wherein the component is transferable between a first system and a second system. The disclosure is advantageously realizable in particular in applications in which a temperature-sensitive component is intended to be regulated to a reference temperature that remains as constant as possible or temperature drifts upon transferring the component into different systems or compartments are intended to be avoided or at least reduced.

BACKGROUND

Microlithography is used for producing microstructured components such as, for example, integrated circuits or LCDs. The microlithography process is carried out in what is called a projection exposure apparatus, which includes an illumination device and a projection lens. The image of a mask (=reticle) illuminated by way of the illumination device is in this case projected by way of the projection lens onto a substrate (e.g. a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process.

In practice when employing replacement components e.g. in such measurement methods, a great sensitivity of the measurement results with respect to temperature changes exists, wherein a temperature control to a few millikelvin is desirable to achieve the desired measurement accuracies. The realization of such exact temperature control, in turn, presents a demanding challenge in practice. One reason for this is that typically, a replacement component used for a current measurement process is taken from a separate holder holding a plurality of different replacement components and transferred into the actual measurement system or a housing accommodating the measurement system, wherein a corresponding thermal adaptation of the relevant systems (holder on the one hand and measurement system on the other) is made more difficult by the thermal loads which are present on both sides and possibly likewise subject to temporal fluctuations.

In addition, after the transfer of the respective replacement component into the measurement system is complete, the approach thereof to a respective target temperature typically takes place over a time period of several hours due to the relevant time constant, with the result that a comparatively long time period passes until a sufficiently high temperature stability of the relevant replacement component is attained.

An insufficient temperature stability of the replacement component, however, results in undesired changes in the optical properties, such as thermally induced refractive index variations and mechanical drift effects in the measurement setup and consequently ultimately errors in the measurement.

In practice, impairments of the temperature stability of the replacement component and associated issues can furthermore result from the fact that the replacement component is typically also exposed to thermal loads during its transfer into the measurement system (i.e. on its way there). Such thermal loads can originate from motors that are used merely by way of example for the transfer (and which may be arranged e.g. at a gripper or robot arm used for handling the replacement component), but also from other components in the environment of the respective transport path. Here, the change in the thermal state of the replacement component that has been caused by the relevant thermal loads can include heating and/or cooling, wherein these effects can also varyingly occur over the entire volume of the replacement component, depending on the relative position of the thermal loads.

Regarding known technology, reference is only made by way of example to EP 1 531 364 B1.

SUMMARY

The present disclosure seeks to provide a method for temperature control of a component, wherein temperature drifts are reduced during the transfer of the component between a first system and a second system and associated issues are at least largely reduced.

According to one aspect, a method according to the disclosure for temperature control of a component, wherein the component is transferable between a first system and a second system, includes the following steps:

ascertaining a temperature drift of a temperature of the component that is to be expected after transfer of the component from the first system into the second system; and modifying a temperature prevailing in the first system and/or temperature prevailing in the second system such that the temperature drift that is actually occurring after transfer of the component from the first system into the second system is reduced with respect to the expected temperature drift.

For temperature control of a component which is transferable between a first and a second system, the disclosure is here in particular based on the concept, for example, not of actuating both systems by specifying identical predetermined temperature values (that is to say e.g. supplying cooling water of the same temperature to cooling apparatuses which are respectively assigned to the systems), but, first, ascertaining the temperature drift (or temporal variation of temperature or temperature change) that is to be expected after transfer of the component from the first system into the second system and modifying on that basis the temperature in at least one of the two systems.

Various strategies are possible both according to the disclosure with respect to the ascertainment of the expected temperature drift and also the subsequent modification of the temperature prevailing in the first system and/or the second system, as will be explained in more detail below.

In accordance with an embodiment, the temperature measurements using a sensor that is attached to the component can be performed before and/or after the transfer of the component from the first system into the second system. Alternatively or additionally, it is also possible for a temperature that is currently prevailing in the first system and/or for a temperature that is currently prevailing in the second system to be measured. Furthermore, a predictive model can be established for predicting a development of the temperature of the component over time after the component has been transferred from the first system into the second system (possibly also in combination with the aforementioned embodiments).

As far as the step of modifying a temperature prevailing in the first system and/or a temperature prevailing in the second system is concerned, this step can be effected by way of modifying the predetermined value of a corresponding temperature regulation, and alternatively or additionally also by way of modifying the operation of at least one structural element that is present in the first system and/or in the second system (with corresponding change in the relevant thermal load).

According to an embodiment, the method further includes the steps of:
 ascertaining a change in the thermal state of the component that is to be expected on the way from the first system to the second system; and
 performing temperature control of the component before it is transferred into the second system in a manner such that the expected change is at least partially compensated.

The disclosure furthermore relates to a method for temperature control of a component, wherein the component is transferable between a first system and a second system, wherein the method includes the following steps:
 ascertaining a change in the thermal state of the component that is to be expected on the way from the first system to the second system; and
 performing temperature control of the component before it is transferred to the second system in a manner such that the expected change is at least partially compensated.

In accordance with an embodiment, the component is transferred into a region which is separate from at least one further component present in the first system before the temperature control.

In accordance with an embodiment, the ascertainment of a change of the thermal state of the component that is to be expected on the way from the first system to the second system is effected by simulating and/or measuring the influence of thermal loads to which the component is exposed on the way from the first system to the second system.

In embodiments of the disclosure, the component includes an optical component, in particular an optical replacement component that is adapted to a test specimen geometry. The wording "adaptation to a test specimen geometry" should be understood here in particular to mean that, for example in the case of a compensation optical unit, the relevant (optical replacement) component is also replaced when the test specimen is replaced or a test specimen having a different geometry or topography is to be measured. For example, the optical replacement component can be a calibration mirror, wherein, depending on the test specimen to be measured, calibration mirrors having different radii of curvature and diameters are swapped for one another.

However, the disclosure is not limited hereto, but is also in principle advantageously realizable in other applications in which a temperature-sensitive component is intended to be regulated to a reference temperature that remains as constant as possible or the problem of temperature drifts upon transferring the component into different systems or compartments is intended to be avoided or at least reduced.

In accordance with an embodiment, the component is a lithography mask. The first system can be a holder for storing a plurality of lithography masks. The second system can be a mask metrology apparatus, which can be used for characterizing structures on the mask with regard to deviations of the respective structure from the nominal/desired position ("registration") and/or with regard to the critical dimension (CD) of the respective structures.

Further configurations of the disclosure can be gathered from the description and the dependent claims.

BRIEF DESCRIPTION OF THE DRAWINGS

The disclosure is explained in greater detail below on the basis of exemplary embodiments illustrated in the accompanying figures, in which.

DETAILED DESCRIPTION OF PREFERRED EMBODIMENTS

Figure 6:
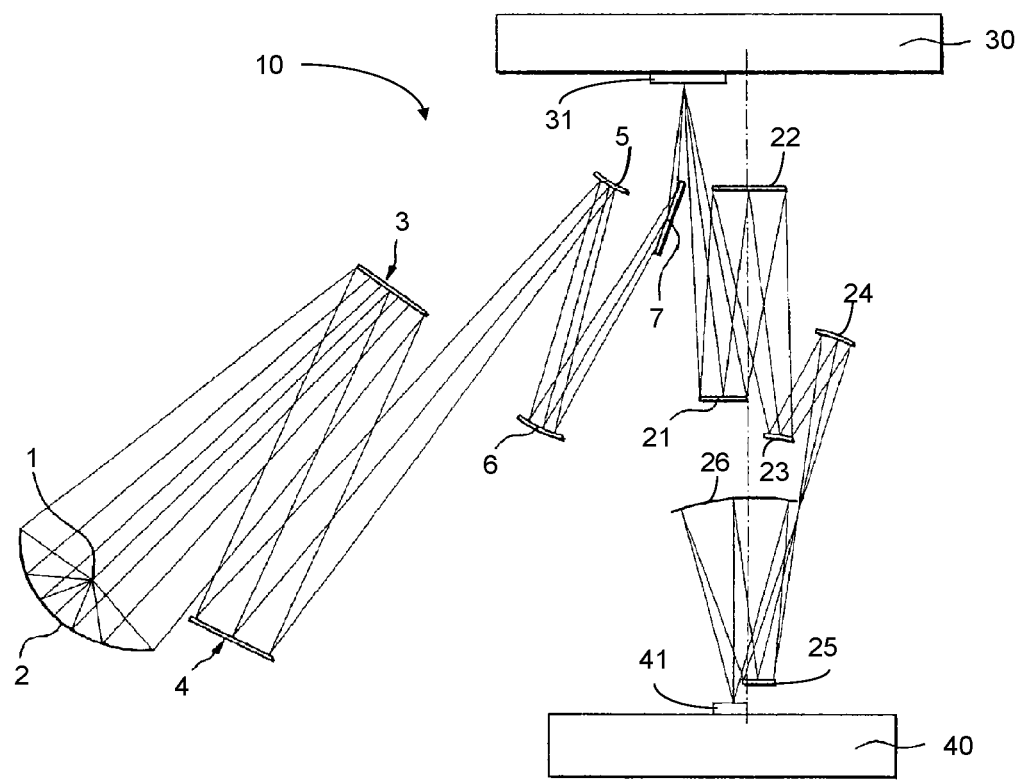
FIG. 6 shows a schematic illustration of a projection exposure apparatus designed for operation in the EUV.

To start, FIG. 6 shows a schematic illustration of a projection exposure apparatus that is given by way of example and is designed for operation in the EUV range.

According to FIG. 6, an illumination device in a projection exposure apparatus 10 designed for EUV includes a field facet mirror 3 and a pupil facet mirror 4. The light from a light source unit including a plasma light source 1 and a collector mirror 2 is directed onto the field facet mirror 3. A first telescope mirror 5 and a second telescope mirror 6 are arranged in the light path downstream of the pupil facet mirror 4. A deflection mirror 7 is arranged downstream in the light path, the deflection mirror directing the radiation that is incident thereon onto an object field in the object plane of a projection lens including six mirrors 21-26. At the location of the object field, a reflective structure-bearing mask 31 is arranged on a mask stage 30, the mask being imaged with the aid of the projection lens into an image plane in which a substrate 41 coated with a light-sensitive layer (photoresist) is situated on a wafer stage 40.

The mirror that is tested within the scope of the disclosure can be e.g. any mirror of the projection exposure apparatus 10, for example the mirrors 21 or 22 of the projection lens, or else the mirror 7 of the illumination device.

Figure 1:
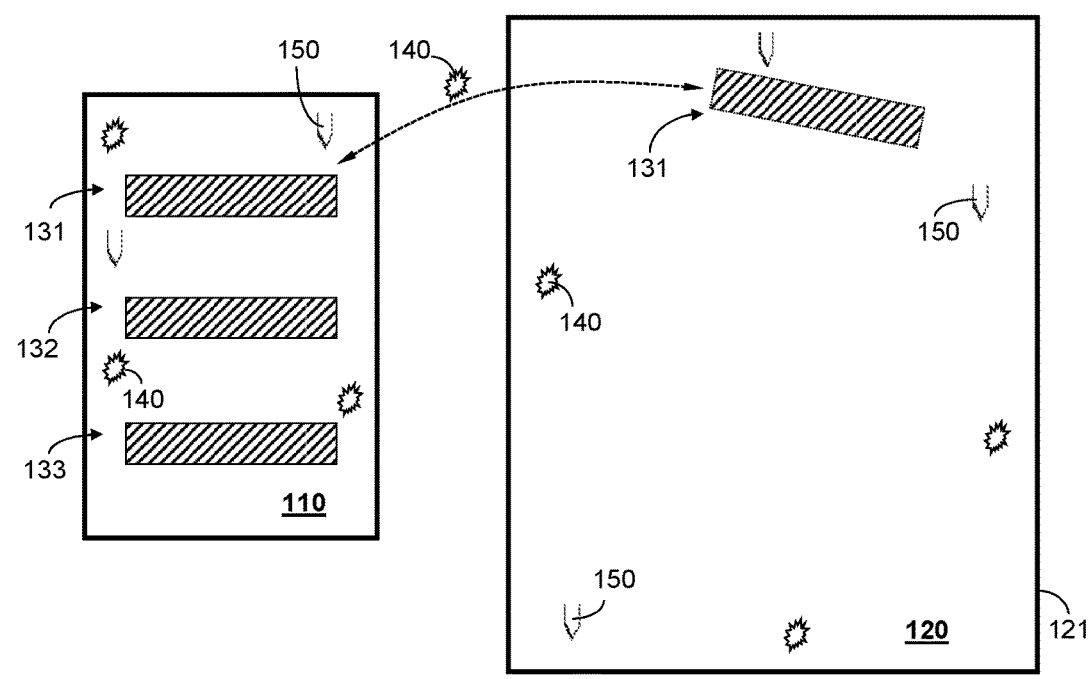
FIGS. 1-5 show schematic illustrations for explaining exemplary embodiments of the present disclosure.

FIG. 1 shows merely a schematic illustration to illustrate a possible scenario in which the method according to the disclosure can be realized.

In this exemplary embodiment, a component 131 which is to be temperature-controlled in accordance with the disclosure is an optical replacement component which is adapted to the test specimen geometry. In accordance with FIG. 1, this component is arranged with a plurality of further components (of which for the sake of simplicity merely two components 132 and 133 are shown) in a holder 110. "120" denotes a measurement arrangement (accommodated in a corresponding housing 121) for testing a mirror, in particular a mirror of a microlithographic projection exposure apparatus. "140" denotes thermal loads, which are merely indicated, both in the holder that forms the first system 110 and in the measurement arrangement that forms the second system 120. As is indicated by the double-headed arrow in FIG. 1, in each case one of the components 131, 132, 133, . . . is transferred into the measurement arrangement, or the second system 120, for use for an interferometric measurement.

For keeping temperature drift effects, and associated impairments of the measurement accuracy, as low as possible during the interferometric measurement here, various embodiments will be described below. What these embodiments have in common is not that, for example, both systems 110, 120 are regulated from the start merely to the same predetermined temperature value, but rather, first, a temperature drift (or temporal variation of temperature or temperature change) that is to be expected after transfer of the respective component from the first system 110 into the second system 120 is ascertained and subsequently a temperature prevailing in the first system 110 and/or a temperature prevailing in the second system 120 is modified in dependence on the expected temperature drift.

In accordance with a first embodiment (described in the flowchart of FIG. 2), a temperature sensor can be attached directly to the relevant component 131 (or 132, 133, . . . ), by way of which sensor a corresponding temperature offset value is obtained with corresponding temperature measurements before or after transfer of the component from the first system 110 into the second system 120 (steps S21 and S22). The temperature offset value in turn can be used as the basis for the modification of the temperature prevailing in the first system 110 or the second system 120 (step S23). As far as the latterly mentioned modification of the temperature in the first system 110 and/or the second system 120 is concerned, the modification can include modifying the predetermined value of a corresponding temperature regulation and/or modifying the operation of at least one structural element present in the relevant system (i.e. the change in a corresponding thermal load).

In accordance with a further embodiment (described in the flowchart of FIG. 3), the ascertainment of the temperature drift of the component 131 (or 132, 133, . . . ) that is to be expected after transfer of the relevant component 131 from the first system 110 into the second system 120 can also be effected using positionally fixed temperature sensors (denoted with "150" in FIG. 1) which are present in the respective system 110 or 120, with the result that the temperature that is currently prevailing in the first system 110 and the temperature that is currently prevailing in the second system 120 can be measured in each case (steps S31 and S32). Based on these measurements, which in further embodiments can also be performed in combination with temperature measurements using a sensor that is attached to the respective component, in accordance with FIG. 2, the temperature prevailing in the first system 110 and/or in the second system 120 is again modified as described above.

Figure 3:
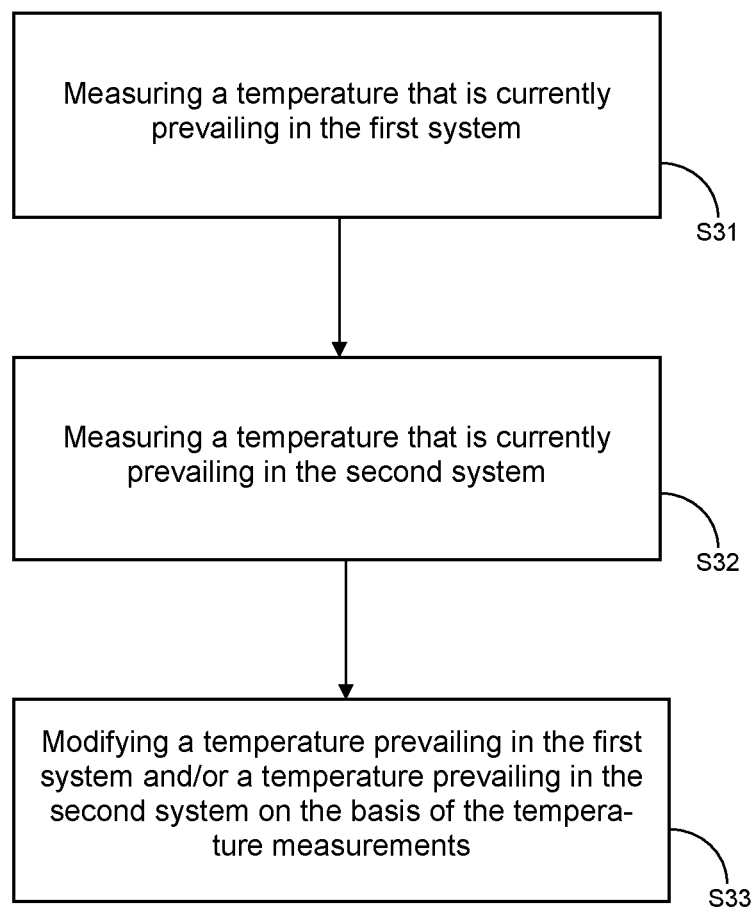
Figure 4:
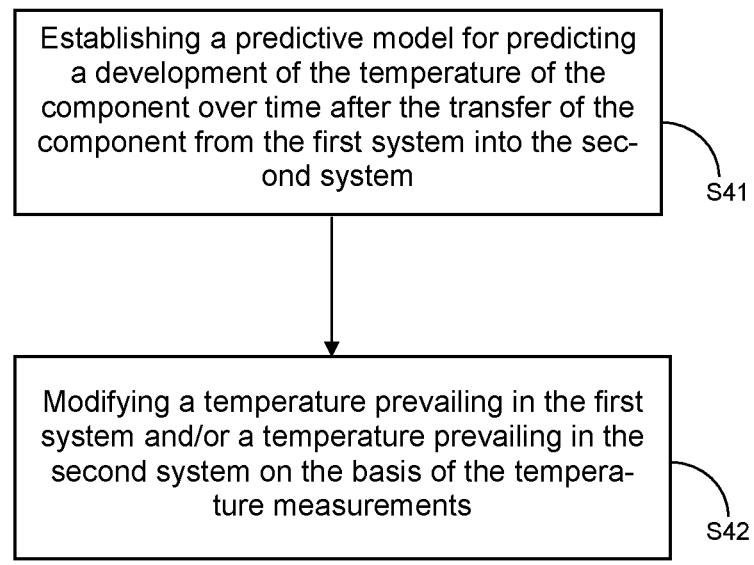

In a further embodiment (which can be realized again in combination with one or both of the embodiments that have been described above with reference to FIG. 2 and FIG. 3), a predictive model is established according to the disclosure (as described in the flowchart of FIG. 4) for predicting a development of the temperature of the relevant component 131 (or 132, 133, . . . ) over time after the transfer from the first system 110 into the second system 120 (step S41), wherein this predictive model is again used as the basis for the modification, performed as has already been described above, of the temperature prevailing in the first system 110 and/or in the second system 120 (step S42).

The predictive model can be established on the basis of experimental data (e.g. with respect to the behaviour of the measurement arrangement over time or of the housing accommodating the latter in dependence on the measurements performed with the measurement arrangement) and/or on the basis of theoretical analyses. In this case, measurement signals of further sensors e.g. with respect to the temperature in the environment or in the clean room and/or the temperature of the housing wall or of the housing accommodating the measurement arrangement may be taken into account during the establishment of the model. Furthermore, it is possible when establishing the model to take account of the fact that different positions of the components in the first system, or holder, could result in different offset values after transfer of the component from the first system 110 into the second system 120 due to the varying proximity with respect to the existing thermal loads. In this way it is possible for example to always perform a modification of the temperature in the first system taking place subsequently in the method according to the disclosure exactly in a manner such that a temperature drift is reduced or minimized for the respective component that is to be transferred next into the second system.

Figure 2:
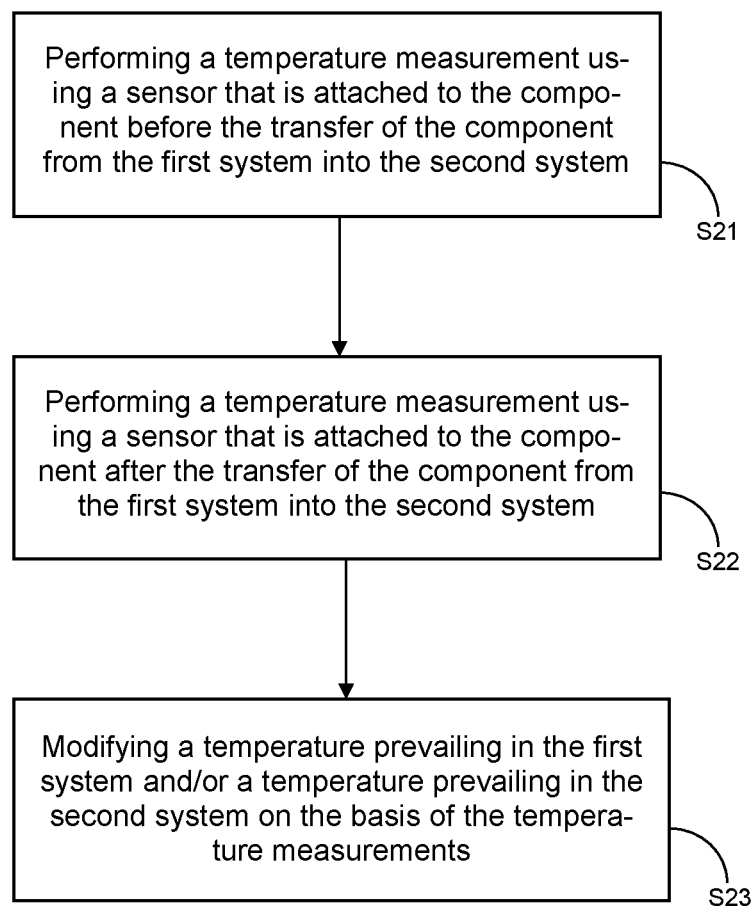

In a further embodiment, the above-described embodiments or steps can also be combined as follows:

At a first stage, a corresponding temperature offset value can be determined, analogously to FIG. 2, with corresponding temperature measurements using a temperature sensor that is attached directly to the relevant component 131 (or 132, 133, . . . ) before or after transfer of the component 131 from the first system 110 into the second system 120 (steps S21 and S22), whereupon a (first) modification of the temperature prevailing in the first system 110 or the second system 120 (step S23) is performed.

Next, the temperature of the relevant component 131, which has been transferred into the second system 120, can continue to be measured or monitored using the temperature sensor that is attached to the component 131 and be used as the basis for a continuous adaptation of the temperature prevailing in the first system 120. It is also possible here to take account of any temperature changes that can occur on a relatively short time scale, which take place in the first and/or second system and can be ascertained in accordance with FIG. 3 (steps S31 and S32).

Finally it is possible, on the basis of the data obtained in the previous steps—and any further data relating to measurement activities of the measurement arrangement—to establish a predictive model, wherein the further development of the temperature of a (replacement) component that is currently used or will be used in future in the measurement arrangement over time can be predicted using the model and be used as a basis for modifying the temperature prevailing in the first system 110 and/or in the second system 120.

In a further embodiment, which will be described below with reference to FIG. 5 and is realizable both in combination with and independently from the above-described embodiments, it is also possible according to the disclosure to take account of thermal loads to which the component 131 is exposed during the transfer into the second system 120 (i.e. on the way there). These may be, merely by way of example, thermal loads that originate from a motor that is located on a gripper arm used for transferring the component 131. Furthermore, the lights may also be any other thermal loads to which the component 131 is temporarily exposed on the way into the second system 120.

Figure 5:
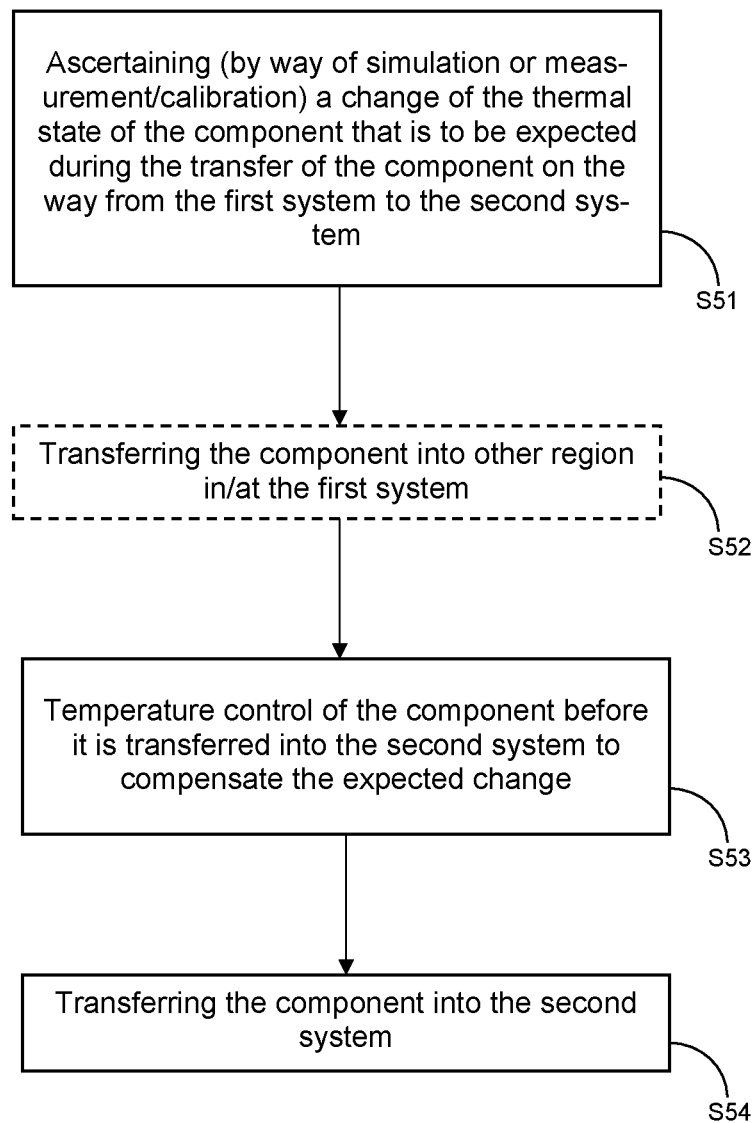

According to FIG. 5, in a first step S51, a thermal change that is to be expected during the transfer of the component 131 from the first system 110 to the second system 120 is first ascertained. This ascertainment can also be performed—with a corresponding knowledge of the relevant thermal loads—as part of a simulation or in a prior measurement or calibration.

In the case of the ascertainment by way of measurement or calibration, it is possible to transfer from the first system 110 to the second system 120 not the component 131 but first a calibration component, wherein it is possible to measure the heating or cooling in a spatially resolved fashion by way of suitable temperature sensors that are provided (e.g. at the calibration component itself or a corresponding mount).

According to FIG. 5, the component 131 which is still located in the first system 110 is transferred, in an optional further step S52, into another region which is located further away from the remaining components 132, 133, . . . in the first system so as to avoid undesired thermal influencing or disturbance of the components 132, 133, . . . , wherein the other region can be located either likewise in the first system 110 or outside it.

Subsequently, in step S53, temperature control of the component 131 is performed to compensate the thermal change that was ascertained in step S51 and is to be expected during the transfer into the second system 120. For this purpose, merely by way of example, one or more heating or cooling elements can be used (e.g. heating or cooling plates, Peltier elements etc.), which can be moved e.g. into the surrounding area of the component 131 or be already present there. The heating or cooling elements can also be used to perform, in spatially resolved fashion (i.e. varying over the surface or the volume of the component 131), heating or cooling of the component 131. Likewise optionally, one or more heat shields can be moved into the region between component 131 and the remaining components 132, 133, . . . in the first system 110 to further minimize thermal influencing or disturbance of the remaining components 132, 133, . . . .

In the case of a locally limited temperature control of the component 131 (which is intended to take account of e.g. a locally limited heating or cooling of the component 131 that is to be expected on the way to the second system 120), which is desired in step S53, the temperature control is preferably performed in step S53 only immediately before the begin of the transfer to the second system 120 in order to avoid a temperature equalization within the component 131 which may otherwise occur in the meantime due to thermal conduction.

Finally, in step S54, the component 131 is transferred into the second system 120. With a suitable temperature control of the component 131, which previously took place in step S53, the component 131 at the end of this transfer process, i.e. at the point of time where the component 131 is placed in the second system 120, reaches exactly the temperature that is desired there, i.e. the thermal loads which act on the component 131 during the transfer on the way between the first system 110 and the second system 120 precisely cancel each other out with the temperature control which was performed for compensation purposes in step S53.

Even though the disclosure has been described on the basis of specific embodiments, numerous variations and alternative embodiments are apparent to a person skilled in the art, for example by combination and/or exchange of features of individual embodiments. Accordingly, it goes without saying for the person skilled in the art that such variations and alternative embodiments are concomitantly encompassed by the present disclosure, and the scope of the disclosure is restricted only within the meaning of the appended patent claims and the equivalents thereof.

What is claimed is:

1. A method of modifying a temperature of an optical replacement component that is adapted to a test specimen geometry, the method comprising:
    a) determining an expected drift of a temperature of the optical replacement component due to transferring the optical replacement component from a first system to a second system; and
    b) modifying a temperature prevailing in the first system and/or a temperature prevailing in the second system so that an actual drift of the temperature of the optical replacement component after transferring the optical replacement component from the first system to the second system is reduced compared to the expected temperature drift determined in a).

2. The method of claim 1, wherein a) comprises measuring a temperature that is currently prevailing in the first system and/or measuring a temperature that is currently prevailing in the second system.

3. The method of claim 1, further comprising performing temperature measurements using a sensor attached to the optical replacement component before and/or after transferring the optical replacement component from the first system to the second system.

4. The method of claim 1, further comprising establishing a model to predict a development of the temperature of the optical replacement component over time after transferring the optical replacement component from the first system to the second system.

5. The method of claim 1, further comprising modifying a predetermined value of a temperature regulation present in the first system and/or in the second system.

6. The method of claim 1, wherein b) comprises modifying operation of as structural element disposed in the first system and/or in the second system.

7. The method of claim 1, further comprising:
    determining an expected change in a thermal state of the optical replacement component during transfer of the optical replacement component from the first system to the second system; and
    before transferring the optical replacement component to the second system, modifying the temperature of the optical replacement component to at least partially compensate the expected change in the thermal state of the optical replacement component during transfer of the optical replacement component from the first system to the second system.

8. The method of claim 7, further comprising, before modifying the temperature of the optical replacement component to at least partially compensate the expected change in the thermal state of the optical replacement component during transfer of the optical replacement component from the first system to the second system, transferring the optical replacement component into a region which is separate from at least one further component present in the first system.

9. The method of claim 7, wherein determining the expected change in a thermal state of the optical replacement component during transfer of the optical replacement component from the first system to the second system comprises simulating and/or measuring an influence of thermal loads to which the optical replacement component is exposed during transfer of the optical replacement component from the first system to the second system.

10. The method of claim 1, wherein the optical replacement component comprises a calibration mirror comprising a mirror curvature adapted to the test specimen geometry, and/or the optical replacement component comprises a calibration mirror comprising a mirror diameter adapted to the test specimen geometry.

11. The method of claim 1, wherein the first system comprises a holder configured to store a plurality of optical replacement components.

12. The method of claim 1, wherein the second system comprises a measurement arrangement configured to test a mirror of a microlithographic projection exposure apparatus.

13. The method of claim 1, wherein the optical replacement component comprises a lithography mask.

14. A method of modifying a temperature of an optical replacement component that is adapted to a test specimen geometry, the method comprising:
   determining an expected change in a thermal state of the optical replacement component during transfer of the optical replacement component from a first system to a second system; and
   before transferring the optical replacement component to the second system, modifying a temperature of the optical replacement component to at least partially compensate the expected change in the thermal state of the optical replacement component during transfer of the optical replacement component from the first system to the second system.

15. The method of claim 14, further comprising, before modifying the temperature of the optical replacement component to at least partially compensate the expected change in the thermal state of the optical replacement component during transfer of the optical replacement component from the first system to the second system, transferring the optical replacement component into a region which is separate from at least one further component present in the first system.

16. The method of claim 14, wherein determining the expected change in a thermal state of the optical replacement component during transfer of the optical replacement component from the first system to the second system comprises simulating and/or measuring an influence of thermal loads to which the optical replacement component is exposed during transfer of the optical replacement component from the first system to the second system.

17. The method of claim 14, wherein the optical replacement component comprises a calibration mirror comprising a mirror curvature adapted to the test specimen geometry, and/or the optical replacement component comprises a calibration mirror comprising a mirror diameter adapted to the test specimen geometry.

18. The method of claim 14, wherein the first system comprises a holder configured to store a plurality of optical replacement components.

19. The method of claim 14, wherein the second system comprises a measurement arrangement configured to test a mirror of a microlithographic projection exposure apparatus.

20. The method of claim 14, wherein the optical replacement component comprises a lithography mask.

\* \* \* \* \*